(12) United States Patent
Chanclou et al.

(10) Patent No.: US 9,602,216 B2
(45) Date of Patent: Mar. 21, 2017

(54) REFLECTIVE LIGHT-EMITTING DEVICE FOR A WDM PON OPTICAL ACCESS NETWORK, THE DEVICE INCLUDING A LIGHT SOURCE WITH AN OPTICAL GAIN MEDIUM

(71) Applicant: Orange, Paris (FR)

(72) Inventors: Philippe Chanclou, Lannion (FR); Fabienne Saliou, Lannion (FR); Benoit Charbonnier, Lannion (FR)

(73) Assignee: ORANGE, Paris (FR)

( * ) Notice: Subject to any disclaimer, the term of this patent is extended or adjusted under 35 U.S.C. 154(b) by 0 days.

(21) Appl. No.: 14/410,531

(22) PCT Filed: Jun. 20, 2013

(86) PCT No.: PCT/FR2013/051443
§ 371 (c)(1),
(2) Date: Dec. 22, 2014

(87) PCT Pub. No.: WO2013/190244
PCT Pub. Date: Dec. 27, 2013

(65) Prior Publication Data
US 2015/0236788 A1 Aug. 20, 2015

(30) Foreign Application Priority Data
Jun. 22, 2012 (FR) .................... 12 55933

(51) Int. Cl.
*H04J 14/06* (2006.01)
*H04B 10/50* (2013.01)
(Continued)

(52) U.S. Cl.
CPC ......... *H04B 10/502* (2013.01); *H04B 10/564* (2013.01); *H04J 14/0227* (2013.01); *H04J 14/06* (2013.01)

(58) Field of Classification Search
CPC . H04B 10/502; H04B 10/564; H04J 14/0227; H04J 14/06
See application file for complete search history.

(56) References Cited

U.S. PATENT DOCUMENTS 6,332,054 B1 12/2001 Ito
6,384,966 B1 5/2002 Dymott
(Continued)

FOREIGN PATENT DOCUMENTS

| EP | 0523766 A1 | 6/1992 |
|----|------------|--------|
| EP | 2512043 A1 | 10/2012 |
| FR | 2799068 A1 | 9/2000 |

OTHER PUBLICATIONS

International Search Report and Written Opinion dated Aug. 9, 2013 for corresponding International Application No. PCT/FR2013/051443, filed Jun. 20, 2013.
(Continued)

*Primary Examiner* — Dzung Tran
(74) *Attorney, Agent, or Firm* — David D. Brush; Westman, Champlin & Koehler, P.A.

(57) ABSTRACT

A reflective light-emitting device is provided for a WDM PON optical access network. The device includes a light source with an optical gain medium. The light-emitting device includes a light source with an optical gain medium, of wavelength that is self-seeding during a go-and-return passage of light between the optical gain medium and an optical reflective component defining the laser cavity. The optical reflective component is made up of an optical amplifier associated reflective optical connection to a polarizing device so that the polarization axis of the reflected light is the same as the polarization axis of the emitted light.

5 Claims, 4 Drawing Sheets

(51) Int. Cl.
  *H04J 14/02* (2006.01)
  *H04B 10/564* (2013.01)

(56) References Cited

U.S. PATENT DOCUMENTS

| | | | | |
|---|---|---|---|---|
| 7,565,084 B1* | 7/2009 | Wach | H04J 14/04 | 398/183 |
| 2011/0129227 A1* | 6/2011 | Wen | H01S 5/0687 | 398/82 |
| 2012/0141128 A1* | 6/2012 | Bai | H04B 10/506 | 398/65 |
| 2012/0269516 A1* | 10/2012 | Liu | H04B 10/2503 | 398/72 |
| 2014/0064727 A1* | 3/2014 | Presi | H04B 10/2572 | 398/49 |

OTHER PUBLICATIONS

Elaine Wong et al., "Current and Next-Generation Broadband Access Technologies", Optical Fiber Communication Conference, 2011. Technical Digest. OFC/NFOEC, IEEE, Mar. 6, 2011 (Mar. 6, 2011), pp. 1-24, XP031946142.

Cho K. Y. et al., "Long-Reach Coherent WDM PON Employing Self-Polarization-Stabilization Technique", Journal of Lightwave Technology, IEEE Service Center, New York, NY, US, vol. 29, No. 4, Feb. 1, 2011 (Feb. 1, 2011), pp. 456-462, XP011329360.

Marco Presi et al., "Stable Self-Seeding of R-SOAs for WDM-PONs", Optical Fiber Communication Conference, 2011. Technical Digest. OFC/NFOEC, IEEE, Mar. 6, 2011 (Mar. 6, 2011), pp. 1-3, XP031946272.

Shinji Yamashita et al., "Polarization Properties of a Reflective Fiber Amplifier Employing a Circulator and a Faraday Rotator Mirror" Journal of Lightwave Technology, IEEE Service Center, New York, NY, US, col. 14, No. 3, Mar. 1, 1996 (Mar. 1, 1996), XP011028468.

French Search Report and Written Opinion dated Mar. 6, 2013 for corresponding French Application No. 1255933, filed Jun. 22, 2012.

English translation of the International Written Opinion dated Aug. 9, 2013 for corresponding International Application No. PCT/FR2013/051443, filed Jun. 20, 2013.

M. Nakamura et al., "Proposal of networking by PON technologies for full land Ethernet services in FTTx", Journal of Lightwave Technology, vol. 22, Issue 11, pp. 2631 2640, Nov. 2004.

N. Nadarajah et al. "Upstream access and local area networking in passive optical networks using self-seeded reflective semiconductor optical amplifier", IEEE Photon. Technol. Lett., vol. 19, No. 19, pp. 1559 1561, Oct. 2007.

D.W. Faulkner, A.L. Harmer, "Broadband Access Networks", Networks and Optical Communications (NOC'97), Book, IOS, pp. 165-172,1997.

* cited by examiner

REFLECTIVE LIGHT-EMITTING DEVICE FOR A WDM PON OPTICAL ACCESS NETWORK, THE DEVICE INCLUDING A LIGHT SOURCE WITH AN OPTICAL GAIN MEDIUM

CROSS-REFERENCE TO RELATED APPLICATIONS

This application is a Section 371 National Stage Application of International Application No. PCT/FR2013/051443, filed Jun. 20, 2013, which is incorporated by reference in its entirety and published as WO 2013/190244 on Dec. 27, 2013, not in English.

FIELD OF THE DISCLOSURE

The present invention relates to the field of telecommunications. Within this field, the invention relates more particularly to optical access networks. Fiber to the home (FTTH) optical access networks are deployed to bring very broad bandwidths to users, i.e. bandwidths of more than 1 gigabit per second (Gigabit/s).

BACKGROUND OF THE DISCLOSURE

Figure 1:
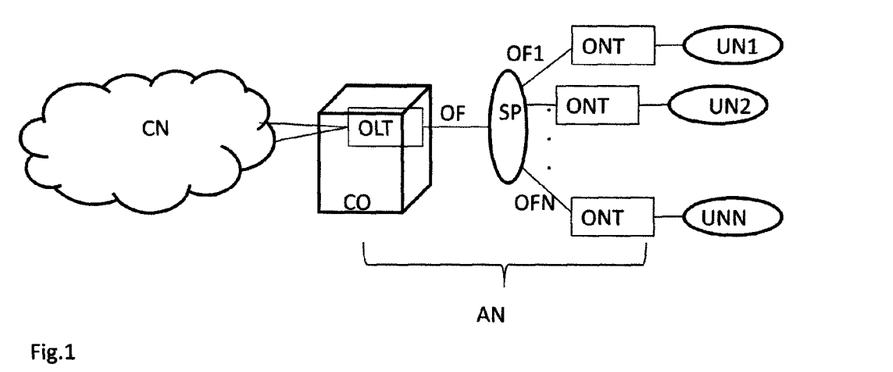
FIG. 1 is a diagram of a prior art passive point-to-multipoint optical fiber architecture.

Among various optical access networks, there are those known more particularly passive optical networks (PON) in a star configuration as shown in FIG. 1, that are based on a passive point-to-multipoint optical fiber architecture as described in particular by D. W. Faulkner and A. L. Harmer, "Broadband access networks", Networks and Optical Communications (NOC'97), Book, IOS, 1997, and by M. Nakamura, H. Ueda, S. Makino, T. Yokotani, and K. Oshima in "Proposal of networking by PON technologies for full land Ethernet services in FTTx", Journal of Lightwave Technology, Volume 22, Issue 11, pp. 2631-2640, November 2004.

The optical access network AN provides the link between user networks UN1, . . . , UNN and the core network CN of the communications network. The PON type optical access network begins at the core network end with optical link terminal (OLT) active equipment that is generally located in a central office CO and that sends and receives data-carrying light signals. At the user network end, the network terminates in optical network terminals (ONTs) that are sometimes referred to as optical network units (ONUs), it being understood that there are as many ONTs as there are user networks UN1, . . . , UNN.

The signal referred to as a "downlink" signal is a signal that propagates from the central office towards a client terminal forming part of the user network, and the signal referred to as the "uplink" signal is a signal that propagates in the opposite direction.

The PON architecture relies on using a passive optical coupler/combiner known as a splitter (SP), i.e. there is no need for it to be electrically powered, thus making it possible to use a 1-to-N topology using an uplink wavelength and a downlink wavelength. Each port of the OLT is connected to an optical coupler SP by a single optical fiber OF. The operation of the coupler SP is based solely on propagation within optical fibers. In the downlink direction, the coupler SP splits the optical signal coming from the OLT into secondary optical fibers OF1 to OFN so that it goes towards the various ONTs. Each ONT then filters the signal destined to the single associated user UN1, . . . , or UNN. In the uplink direction, optical signals coming from the users are combined by each user complying with an access protocol, such as time division multiple access (TDMA), etc. Usually, all of the ONTs transmit at the same wavelength for reasons of cost.

Optical access networks are the subject of recommendations or standards that have already been published or that are being prepared within the Institute of Electrical and Electronic Engineers (IEEE) and the International Telecommunication Union Telecommunication Standardization Sector (ITU-T), and more particularly within the Full Services Access Network (FSAN) group. Among the various standards, the Ethernet and Gigabit passive optical network (EPON and GPON) standards are presently emerging: both of them serve to reach rates greater than 1 Gbit/s. Thus a G-PON network can deliver rates of 2.5 Gbit/s in the downlink direction and 1.25 Gbit/s in the uplink direction for 32 or 64 clients. An access network seeking to achieve 10 Gbit/s transmission is being finalized within IEEE 802.3, ITU-T SG15 Q2, and the FSAN group for an Ethernet PON version.

Figure 2:
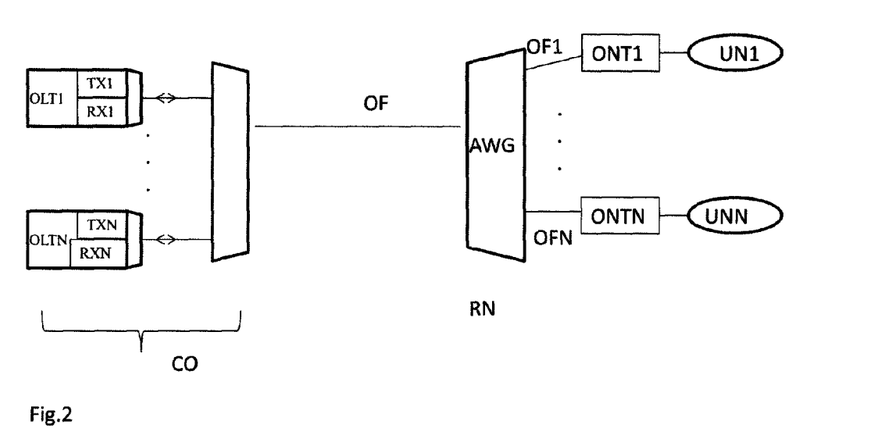
FIG. 2 is a diagram of a prior art WDM PON access network architecture.

In parallel with those bodies, exchanges are taking place between economic players that are leading to the definition of a wavelength division multiplex (WDM) PON. Such a network is characterized by each client terminal corresponding to a signal transmission wavelength allocated by the central office. With reference to FIG. 2, the OLT has a multiplexer/demultiplexer that performs wavelength multiplexing/demultiplexing for each client terminal, and the coupler is replaced by a client access node RN that includes a multiplexer/demultiplexer performing wavelength multiplexing/demultiplexing for each client. Given that the ONTs need to be manufactured in large numbers, their cost influences the technological choices that are made for deploying optical access networks. In particular, the technology that makes it possible to obtain identical ONTs while still being compatible with an uplink wavelength that is configurable and specific to each user may turn out to be a good candidate for such networks. It is thus generally considered that ONTs should be "colorless".

Figure 3:
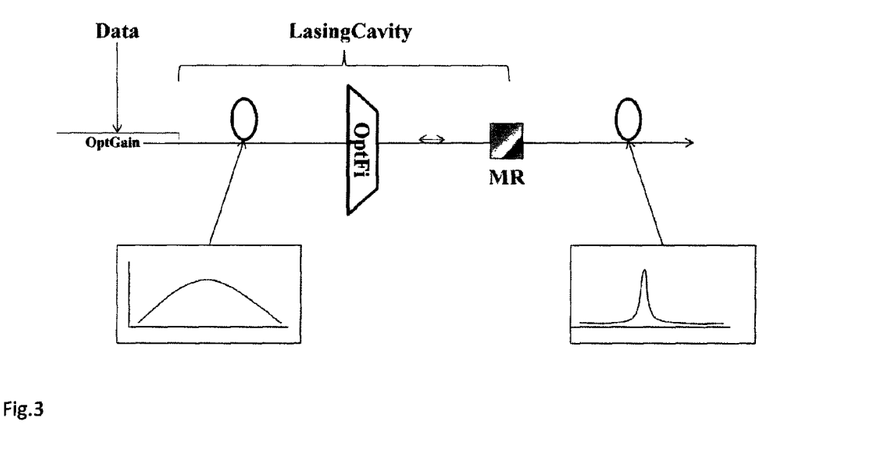
FIG. 3 is a diagram showing the self-seeding technique for a light source (typically an RSOA or an SOA).

A recent so-called "self-seeded" technology, an implementation of which is described in [1], enables the allocation of wavelengths to be self-organizing in passive manner, more particularly for uplink signals, and thus for the emitter modules that are to be found in the ONTs of a WDM PON access network. That technique is shown in FIG. 3, and it is based on adding a partially reflective optical component in the laser cavity of each ONT emitter module, which component is typically a mirror MR. The partially reflective optical component enables the light source OptGain to self-seed its emission wavelength on the principle of light going and returning between the mirror MR and the source OptGain, which is a medium having optical gain. The partially reflective mirror MR necessarily operates partially in transmission. Typically, the light source is a reflective semiconductor optical amplifier (RSOA) or a semiconductor optical amplifier (SOA) associated with a reflective modulator. The wavelength is selected by an optical filter, generally an arrayed wavelength grating (AWG) that co-operates with the RSOA source.

Figure 4:
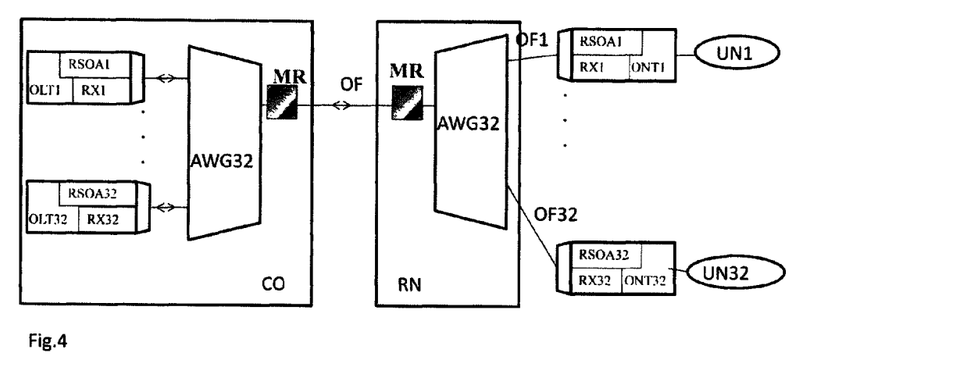
FIG. 4 is a diagram of a WDM PON access network architecture making use of a prior art technique for self-seeding the light source.

A system using that self-seeded technique is shown in FIG. 4. The central office CO has 32 pieces of terminal equipment OLT, each having a self-seeded RSOA source, i.e. a source co-operating with an optical filter and a semi-reflective optical component that co-operates with the source to define the laser cavity, the filter being in the cavity. Each OLT also has a receiver for detecting the uplink signal coming from an ONT. The optical filter is an AWG having 32 channels associated with a single semireflective mirror.

The architecture of the RN client access node is symmetrical with that of the central office CO: 32 optical units ONT, each having a self-seeded RSOA light source and a receiver for detecting the downlink signal coming from an OLT. The self-seeded RSOA sources co-operate with an optical filter, a 32-channel AWG, and a semireflective mirror MR. The RSOA light sources emit in the L and C bands respectively for the uplink and downlink signals.

The principle of wavelength self-seeding on which the technique is based suffers from the drawback of introducing optical losses between the mirror and the light source. In order to obtain the laser effect, it is necessary for the gain that is delivered by the optical medium to be greater than the losses due to the various optical elements.

SUMMARY

The present invention proposes a light-emitting device that is less sensitive to optical losses between the mirror and the light source.

Thus, the invention provides a light-emitting device for a WDM PON optical access network, the device comprising a light source with an optical gain medium, of wavelength that is self-seeding during a go-and-return pass of light between the optical gain medium and an optical reflective component defining the laser cavity, the device being characterized in that the optical reflective component is made up of an optical amplifier associated in an optical reflective connection with a polarizing device determined so that the polarization axis of the reflected light is the same as the polarization axis of the emitted light.

Thus, according to the invention, the semireflecting mirror used in the prior art self-seeded technique is replaced by an optical amplifier associated with a polarizing device that is determined on the basis of a reflective optical connection with the polarizing device (a loop type connection or a connection with a mirror). The light source with an optical gain medium, typically an RSOA or an SOA source, emits with a single polarization axis. The co-operation between the optical amplifier and the polarizing device as determined by the invention causes the light beam that returns to the light source to be polarized on the same polarization axis as the emitted beam. Thus, the polarization of the reflective beam is either in the same direction as that of the emitted beam, or else in the opposite direction (180°). The co-operation thus leads to the same polarization modulo 180° between the emitted and reflective beams. Replacing the mirror by a reflective optical amplifier associated with a determined polarizing device advantageously makes it possible to obtain optical gain, and consequently to increase capacity for tolerating optical losses due to the various optical components.

In an embodiment, the optical reflective connection involves an optical loop between the optical amplifier PA and the polarizing device PD, the optical amplifier has determined polarization, and the polarizing device comprises:
- a polarization separator between the light source and the optical loop; and
- a 180° polarization rotator that co-operates in the optical loop with the polarization separator and the polarized optical amplifier so that the reflected light has the same polarization axis as the emitted light.

In this embodiment, the assembly formed by the light source with the optical gain medium and the amplifier is typically an SOA source that is polarized in a determined manner. The 180° polarization rotator is a Faraday rotator.

This embodiment is advantageous in that the polarized optical amplifier delivers more gain and optical power than an optical amplifier that is independent of polarization.

In an embodiment, the polarizing device PD is reflective and the optical reflective connection is of the mirror type between the optical amplifier PA and the reflective polarizing device PD, the amplifier is independent of wavelength, and the polarizing device is a 180° Faraday mirror that defines the laser cavity and that co-operates with the optical amplifier so that the polarization axis of the reflected light is the same as the polarization axis of the emitted light.

In this embodiment, the amplifier amplifies two different polarizations. Compared with the above embodiment, this embodiment presents the advantage of not requiring a polarization separator.

In an embodiment, the light-emitting device further comprises an optical power coupler interposed in the path of the input/output beam of the light-emitting device.

In this embodiment, the coupler amplifies both the beam transmitted to the remote terminal device OLT or ONT from the WDM PON optical access network, and also the beam coming from that terminal device as input to the light-emitting device.

In addition, the invention provides a WDM PON access network comprising two multiplexer/demultiplexers and optical devices each having a light source with an optical gain medium, of wavelength that is self-seeding on a go-and-return passage of light between the optical gain medium and an optical reflective component defining the laser cavity, such that:
- the optical reflective component is an optical amplifier associated with a polarizing device determined so that the polarization axis of the reflected light is the same as the polarization axis of the emitted light; and
- the optical reflective component is common to the light-emitting devices of the uplink and of the downlink and is inserted between the two multiplexer/demultiplexers.

This embodiment is particularly suitable when the amplifying medium, and more generally the optical amplifier, in a reflective optical connection has sufficient bandwidth to cover both the bandwidth of the uplink beams and the bandwidth of the downlink beams.

The invention also provides a WDM PON access network comprising two multiplexer/demultiplexers, two optical reflective components, and light-emitting devices each having a light source with an optical gain medium, of wavelength that is self-seeding on a go-and-return passage of light between the optical gain medium and the optical reflective component that defines the laser cavity, such that:
- an optical reflective component is an optical amplifier associated with a polarizing device determined so that the polarization axis of the reflected light is the same as the polarization axis of the emitted light; and
- the two optical reflective components are common both to the uplink bandwidth and to the downlink bandwidth.

This embodiment is particularly suitable when the amplifier medium, and more generally the optical amplifier, does not have sufficient bandwidth to cover the bandwidth of the uplink beams and the bandwidth of the downlink beams.

In a particular embodiment, the network further comprises two multiplexer/demultiplexer pairs mounted back to back, one for the uplink passband and one for the downlink passband, the optical reflective component associated with the uplink passband defines the laser cavities of the light-emitting devices of the clients and is inserted between the two demultiplexers of one of the pairs, the optical reflective component associated with the downlink passband defines the laser cavities for the light-emitting devices of the central office and is inserted between the two demultiplexers of the other pair.

BRIEF DESCRIPTION OF THE DRAWINGS

Other characteristics and advantages of the invention appear from the following description made with reference to the accompanying figures that are given as non-limiting examples.

DETAILED DESCRIPTION OF ILLUSTRATIVE EMBODIMENTS

In the various figures, the same references and symbols are used for designating items that are similar.

Figure 5:
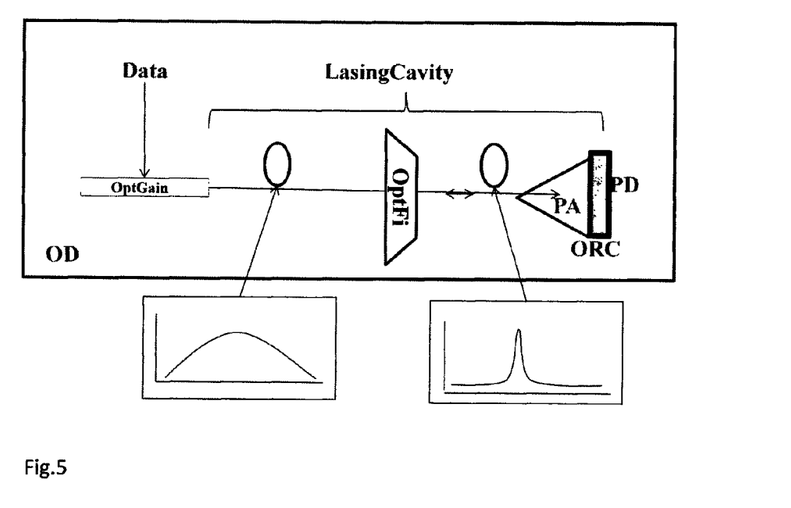
FIG. 5 is a diagram of a particular embodiment of a light source of the invention.

FIG. 5 is a diagram of an optical device OD of the invention. The optical device OD is for a WDM PON optical access network. More particularly, the optical device OD is for being divided between firstly an optical network terminal ONT on client premises and secondly a client remote node RN, or for being divided between firstly an optical terminal device such as an OLT and secondly a multiplexer/demultiplexer in an central office.

The light-emitting device OD comprises a light source with an optical gain medium OptGain having a wavelength that is self-seeded on light passing back and forth between the optical gain medium and an optical reflective component ORC defining the laser cavity. This source is typically an RSOA source or an SOA source forming part of an optical terminal device OLT or ONT respectively in the central office or on client premises. The optical reflective component ORC is a bidirectional optical amplifier PA associated in a reflective arrangement with a polarizing device PD that is arranged so that the polarization axis of the reflective light is the same as the polarization axis of the emitted light. The optical reflective component ORC typically forms part of the central office or of the client remote node. The light-emitting device comprises a conventional optical fiber OptFi, typically an AWG, that forms part of a multiplexer/demultiplexer, which itself forms part of the central office or of the client remote node.

Figure 6:
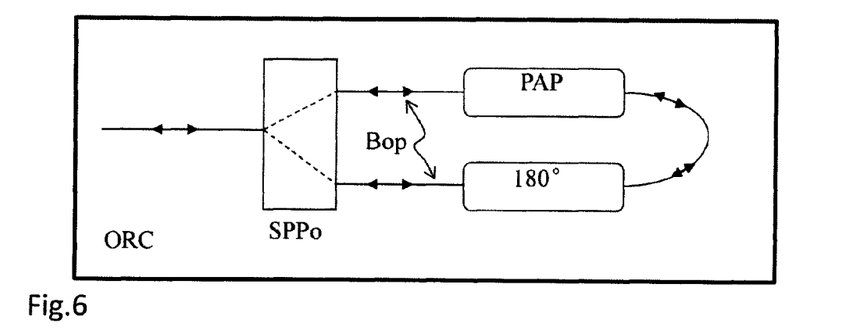
FIG. 6 is a diagram of a particular embodiment of the optical reflective component ORC.

In a particular embodiment of the optical reflective component ORC, shown diagrammatically in FIG. 6, the reflective arrangement corresponds to a loop type optical connection between the optical amplifier PA and the polarizing device PD. In this embodiment, the optical reflective connection involves an optical loop between the optical amplifier PA and the polarizing device PD, the optical amplifier having determined polarization and the polarizing device comprising:
  a polarization separator SPPo between the light source and the optical loop Bop; and
  a 180° polarization rotator that co-operates in the optical loop Bop with the polarization separator SPPo and the polarized optical amplifier PAP so that the reflected light has the same axis of polarization as the emitted light.

Figure 7:
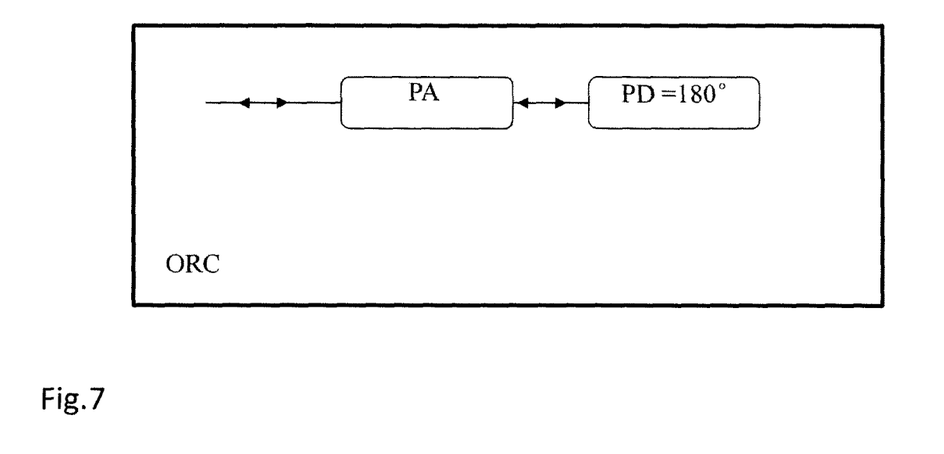
FIG. 7 is a diagram of a particular embodiment of the optical reflective component ORC.

In a particular embodiment of the optical reflective component ORC, shown diagrammatically in FIG. 7, the reflective arrangement corresponds to a mirror type optical connection between the optical amplifier PA and the polarizing device PD. In this embodiment, the amplifier PA is independent of wavelength and the polarizing device PD is a 180° Faraday mirror that defines the laser cavity and that co-operates with the amplifier so that the polarization axis of the reflective light is the same as the polarization axis of the emitted light.

In a particular embodiment, the light-emitting device further comprises an optical power coupler interposed in the path of the input/output beam of the light-emitting device.

Figure 8:
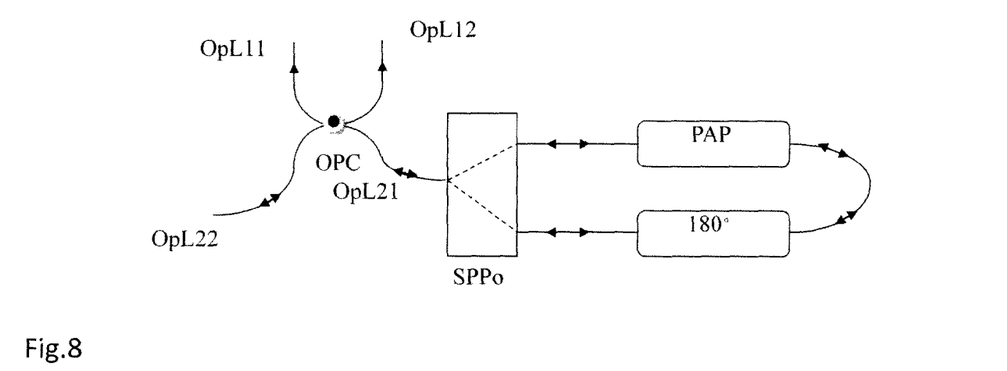
FIG. 8 is a diagram of a first configuration of the optical power component OPC as an input/output for the polarization separator SPPo of the optical reflective component ORC.
Figure 9:
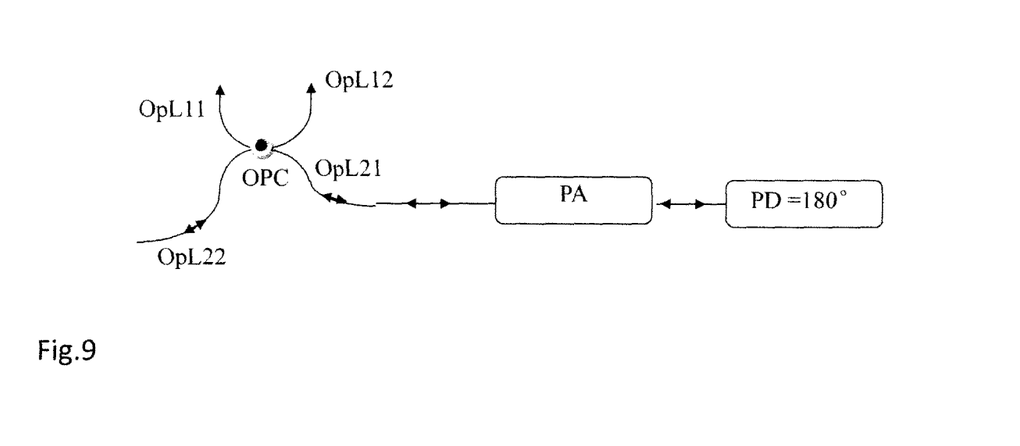
FIG. 9 is a diagram of a second configuration of the optical power component OPC as an input/output for the optical amplifier PA of the optical reflective component ORC.

In a first configuration shown diagrammatically in FIG. 8, the optical power coupler OPC is arranged as an input/output for the polarization separator SPPo. In a second configuration, shown diagrammatically in FIG. 9, the optical power coupler OPC is arranged as an input/output for the optical amplifier PA.

The optical coupler may be of the 2-to-2 type or of the 1-to-2 type. The two outlet points OptL11 and OptL12 are for transmitting the transmitting signals. For a 2-to-1 type coupler, only one outlet from the coupler is used for transmitting signals. One of the inlet points OptL21 of the coupler is connected as an input/output to the reflective optical component. The second inlet point OptL22 is connected to the optical filter (not shown in FIGS. 8 and 9).

Figure 10:
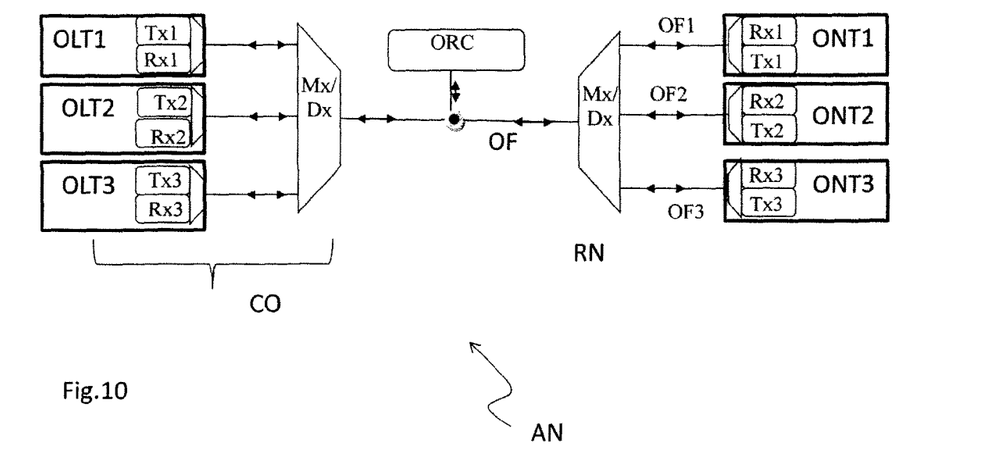
FIG. 10 is a diagram of a first implementation of a light-emitting device of the invention in a WDM PON access network.

FIG. 10 is a diagram of a first embodiment of a light-emitting device of the invention in a WDM PON access network. In this embodiment, the WDM PON access network AN comprises a single optical reflective component ORC between the multiplexers/demultiplexers Mx/Dx respectively of the central office CO and of the client remote node RN. This embodiment corresponds to an optical reflective component ORC that possesses an amplification passband that is not less than the bandwidths used for the uplink and for the downlink. In this embodiment, the optical reflective component ORC is common to the light-emitting devices of the invention in the client terminals ONT and in the central office OLT. For example, the emitters Tx1, Tx2, and Tx3 of three clients operate respectively in the deep red, the light red, and the very light red, and the receivers Rx1, Rx2, and Rx3 of the three clients operate respectively in the deep blue, in the light blue, and the very light blue. The secondary optical fibers OF1, OF2, and OF3 transmit two wavelengths simultaneously in the uplink and in the downlink, specifically deep red and deep blue, light red and light blue, or very light red and very light blue. The multiplexer/demultiplexer Mx/Dx of the client remote node RN has an optical filter that is typically an AWG. The multiplexer/demultiplexer Mx/Dx of the client remote node RN multiplexes the signals of the uplinks on the optical fiber OF and demultiplexes the signals for the downlinks on the secondary fibers OF1, OF2, and OF3. Thus, in the downlink direction, the multiplexer/demultiplexer Mx/Dx of the client remote node RN separates the blue wavelengths depending on their deep, light, and very light differences. The demultiplexing function of the multiplexer/demultiplexer of each ONT separates the downlink blue wavelength from the red wavelength. The multiplexer/demultiplexer of each ONT1, ONT2, and ONT3 matches the receiver Rx1, Rx2, Rx3 and the emitter Tx1, Tx2, Tx3 to the secondary optical fiber OF1, OF2, and OF3. Each emitter Tx1, Tx2, Tx3 has a light source with an optical gain medium OptGain that interacts with the optical reflective component ORC that defines the laser cavity. At the central office CO, operation is symmetrical.

Figure 11:
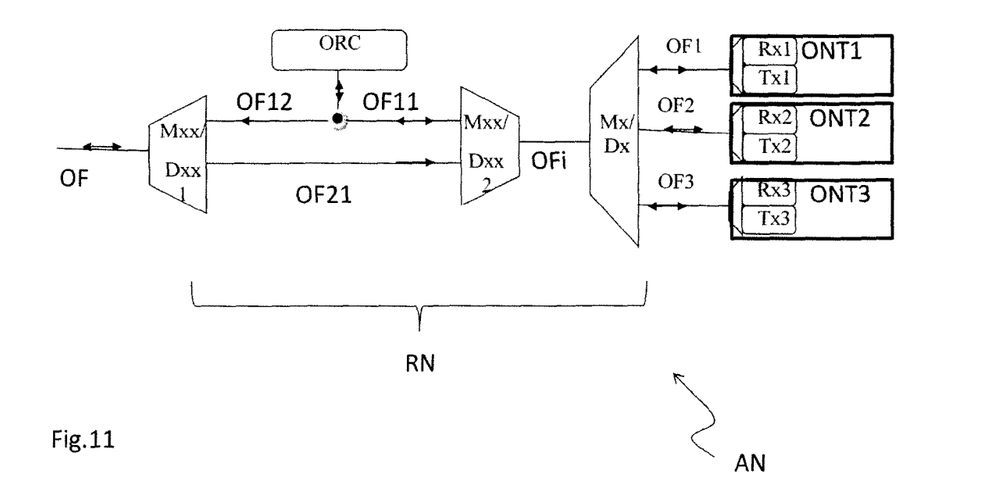
FIG. 11 is a diagram of a second configuration of a light-emitting device of the invention in a WDM PON access network.

FIG. 11 is a diagram of a second implementation of a light-emitting device of the invention in a WDM PON access network. The diagram shows only a portion of the access network AN, the portion at the client end. The portion at the central office end is symmetrical. In this embodiment, the WDM PON access network has two multiplexer/demultiplexers Mxx/Dxx1, Mxx/Dxx2 arranged back to back to separate the uplinks and downlinks and respectively to recombine them, together with an optical reflective component ORC of the invention, which is inserted in the uplink between the multiplexer/demultiplexers Mxx/Dxx1, Mxx/Dxx2.

For example, the emitters Tx1, Tx2, Tx3 of the three terminals ONT1, ONT2, ONT3 operate respectively in deep red, light red, and very light red, and the receivers Rx1, Rx2, Rx3 of the three terminals ONT1, ONT2, ONT3 operate respectively in deep blue, light blue, and very light blue. The secondary optical fibers OF1, OF2, OF3 transmit two wavelengths simultaneously in the uplink and downlink directions, respectively deep red and deep blue, light red and light blue, and very light red and very light blue. The multiplexer/demultiplexer Mx/Dx has an optical filter which is typically an AWG. The multiplexer/demultiplexer Mx/Dx multiplexes the uplink signals on the optical fiber OFi and demultiplexes the downlink signals to the secondary fibers OF1, OF2, and OF3. Thus, in the downlink direction, the multiplexer/demultiplexer Mx/Dx separates the blue wavelengths depending on whether they are deep, light, or very light. The demultiplexing function of the multiplexer/demultiplexer in each terminal ONT1, ONT2, ONT3 separates the downlink blue wavelength from the red wavelength. The multiplexer/demultiplexer of each terminal ONT1, ONT2, ONT3 matches the receiver Rx1, Rx2, Rx3 and the emitter Tx1, Tx2, Tx3 to the secondary optical fiber OF1, OF2, and OF3. Each emitter Tx1, Tx2, Tx3 has a light source with an optical gain medium OptGain that interacts with the optical reflective component ORC that defines the laser cavity.

The multiplexer/demultiplexer Mxx/Dxx1 separates the uplinks and downlinks conveyed over the optical fiber OF. Thus, the multiplexer/demultiplexer Mxx/Dxx1 separates the downlink blue wavelengths from the uplink red wavelengths. The multiplexer/demultiplexer Mxx/Dxx2 multiplexes the downlink wavelengths with the uplink wavelengths on the optical fiber OFi. In addition, the wavelength of the light source in each emitter Tx1, Tx2, Tx3 is self-seeded as a result of light going and returning between the optical gain medium and the optical reflective component ORC that defines the laser cavity. The multiplexer/demultiplexer Mxx/Dxx2 filters the lightwaves emitted by the emitters Tx1, Tx2, Tx3 on their go-and-return optical passes in the laser cavity defined by each emitter Tx1, Tx2, Tx3 and the optical reflective component ORC, and multiplexes the return wave transmitted over the fiber OF11 to the fiber OFi with the downlink wavelengths.

[1] N. Nadarajah et al. "Upstream access and local area networking in passive optical networks using self-seeded reflective semiconductor optical amplifier", IEEE Photon. Technol. Lett., Vol. 19, No. 19, pp. 1559-1561, October 2007.

Although the present disclosure has been described with reference to one or more examples, workers skilled in the art will recognize that changes may be made in form and detail without departing from the scope of the disclosure and/or the appended claims.

The invention claimed is:

1. A light-emitting device for a wavelength division multiplex (WDM) passive optical network (PON) optical access network, the device comprising:
 a light source with an optical gain medium, of wavelength that is self-seeding during a go-and-return pass of light between the optical gain medium and an optical reflective component defining a laser cavity;
 wherein the optical reflective component is made up of an optical amplifier associated in an optical reflective connection with a polarizing device determined so that the polarization axis of the light reflected by the optical reflective component is the same as the polarization axis of the light emitted by the light source, wherein:
 the optical reflective connection comprises an optical loop between the optical amplifier and the polarizing device,
 the optical amplifier has determined polarization, and
 the polarizing device comprises:
  a polarization separator between the light source and the optical loop; and
  a 180° polarization rotator that co-operates in the optical loop with the polarization separator and the polarized optical amplifier so that the reflected light has the same polarization axis as the emitted light.

2. The light-emitting device according to claim 1, further comprising an optical power coupler interposed in a path of an input/output beam of the light-emitting device.

3. A wavelength division multiplex (WDM) passive optical network (PON) access network for uplink and downlink transmissions, comprising:
 first and second multiplexer/demultiplexers and light-emitting devices for uplink transmission or for downlink transmission each having a light source with an optical gain medium, of wavelength that is self-seeding on a go-and-return passage of light between the optical gain medium and an optical reflective component defining the laser cavity,
 wherein the optical reflective component is an optical amplifier associated in an optical reflective connection with a polarizing device determined so that the polarization axis of the reflected light is the same as the polarization axis of the emitted light; and
 wherein the optical reflective connection comprises an optical loop between the optical amplifier and the polarizing device,
 the optical amplifier has determined polarization,
 the polarizing device comprises:
  a polarization separator between the light source and the optical loop; and a 180° polarization rotator that co-operates in the optical loop with the polarization separator and the polarized optical amplifier so that the reflected light has the same polarization axis as the emitted light, and the optical reflective component is common to the uplink and to the downlink light emitting devices and is inserted between the first and second multiplexer/demultiplexers.

4. A wavelength division multiplex (WDM) passive optical network (PON) access network (AN) for uplink and downlink transmissions comprising:

first and second multiplexer/demultiplexers, first and second optical reflective components, and light-emitting devices for uplink transmission or for downlink transmission, each having a light source with an optical gain medium, of wavelength that is self-seeding on a go-and-return passage of light between the optical gain medium and the optical reflective component that defines the laser cavity, wherein the first and second optical reflective components are optical amplifiers associated in an optical reflective connection with a polarizing device determined so that the polarization axis of the reflected light is the same as the polarization axis of the emitted light;

wherein:

the optical reflective connection comprises an optical loop between the optical amplifier and the polarizing device, the optical amplifier has determined polarization, and the polarizing device comprises:

a polarization separator between the light source and the optical loop; and a 180° polarization rotator that co-operates in the optical loop with the polarization separator and the polarized optical amplifier so that the reflected light has the same polarization axis as the emitted light; and wherein the first and second optical reflective components are common both to uplink passband and to downlink passband.

5. The wavelength division multiplex (WDM) passive optical network (PON) access network according to claim 4, further comprising:

two multiplexer/demultiplexer pairs mounted back to back, one for the uplink passband and one for the downlink passband, wherein the optical reflective component associated with the uplink passband defines laser cavities of the light-emitting devices of clients and is inserted between the two demultiplexers of one of the pairs, the optical reflective component associated with the downlink passband defines the laser cavities for the light-emitting devices of a central office and is inserted between the two demultiplexers of the other pair.

* * * * *